United States Patent [19]

Kuang

[11] Patent Number: 5,159,533

[45] Date of Patent: Oct. 27, 1992

[54] PORTABLE NOTE-BOOK COMPUTER EXPANSION DEVICE WITH DISK DRIVES

[76] Inventor: Ma H. Kuang, Rm. 813, 8 FL, Chia Hsin Building 2, No. 96, Chung Shan N. Rd., Taipei, Taiwan

[21] Appl. No.: 696,758

[22] Filed: May 7, 1991

[51] Int. Cl.⁵ .......................... H05K 5/02; G06F 1/00
[52] U.S. Cl. .................................... 361/391; 361/392; 364/708
[58] Field of Search ............... 361/380, 390, 391, 392, 361/393, 394, 395, 399; 364/708, 709.1

[56] References Cited

U.S. PATENT DOCUMENTS

| | | | |
|---|---|---|---|
| 4,564,751 | 1/1986 | Alley et al. | 364/708 X |
| 4,680,674 | 7/1987 | Moore | 361/395 |
| 4,739,451 | 4/1988 | Kuba | 361/394 |
| 4,788,658 | 11/1988 | Hanebuth | 364/708 X |
| 4,903,222 | 2/1990 | Carter et al. | 364/708 |
| 4,926,365 | 5/1990 | Hsieh | 364/708 |
| 4,991,058 | 2/1991 | Watkins et al. | 361/391 |
| 4,996,628 | 2/1991 | Harvey et al. | 361/393 |
| 5,036,313 | 7/1991 | Lin et al. | 361/395 X |

FOREIGN PATENT DOCUMENTS 2607868  9/1976  Fed. Rep. of Germany ...... 364/708

Primary Examiner—Leo P. Picard
Assistant Examiner—Michael W. Phillips
Attorney, Agent, or Firm—Bucknam and Archer

[57] ABSTRACT

A portable note-book computer expansion device for holding and connecting a note-book computer to increase its capacity and functions, comprising a base having a mother board, which has a plurality of expansion slots for mounting a variety of expansion cards, a hard disk drive and a floppy disk drive fastened therein, and a note-book computer holder mounted on the base at the top for holding a note-book computer permitting the expansion cards, the hard disk drive and the floppy disk drive to be respectively connected to the note-book computer.

1 Claim, 3 Drawing Sheets

PORTABLE NOTE-BOOK COMPUTER EXPANSION DEVICE WITH DISK DRIVES

BACKGROUND OF THE INVENTION

The present invention relates to a portable note-book computer expansion device and relates more particularly to such a portable note-book computer expansion device which has a space therein for holding a note-book computer to greatly expand the capacity and function of said note-book computer.

Computerization has become the inevitable way to keep a company developing or a factory or organization working more efficiently. From the original desk-top computers to the lap-top and note-book computers which were developed in recent years, computer hardware equipment has become more and more compact and easy to carry. In regular portable computers, working voltage is generally supplied from a DC power supply. Therefore, power-fail problem may happen frequently. Further, due to limited space, a portable computer does not provide many expansion slots for use. In U.S. patent application Ser. No. 491,321, now U.S. Pat. No. 5,058,045, the present inventor disclosed a structure of battery and expansion slot changeable computer which can be alternatively connected to either AC or DC power supply and, the battery chamber therein can be replaced with an expansion slot to expand its function. However, this improvement can not fully satisfy all requirements. For example, IBM functional cards can not be used in regular portable computers due to limited space or size.

The present invention has been accomplished under the circumstances in view. It is therefore the main object of the present invention to provide a portable note-book computer expansion device which is convenient for use to increase the capacity and functions of a note-book computer.

BRIEF DESCRIPTION OF THE DRAWINGS

FIG. 2A is an enlarge view of the hook circled in FIG. 2;

FIG. 2B is an enlarged view of the latch circled in FIG. 2; and

DETAILED DESCRIPTION OF THE PREFERRED EMBODIMENT

Figure 1:
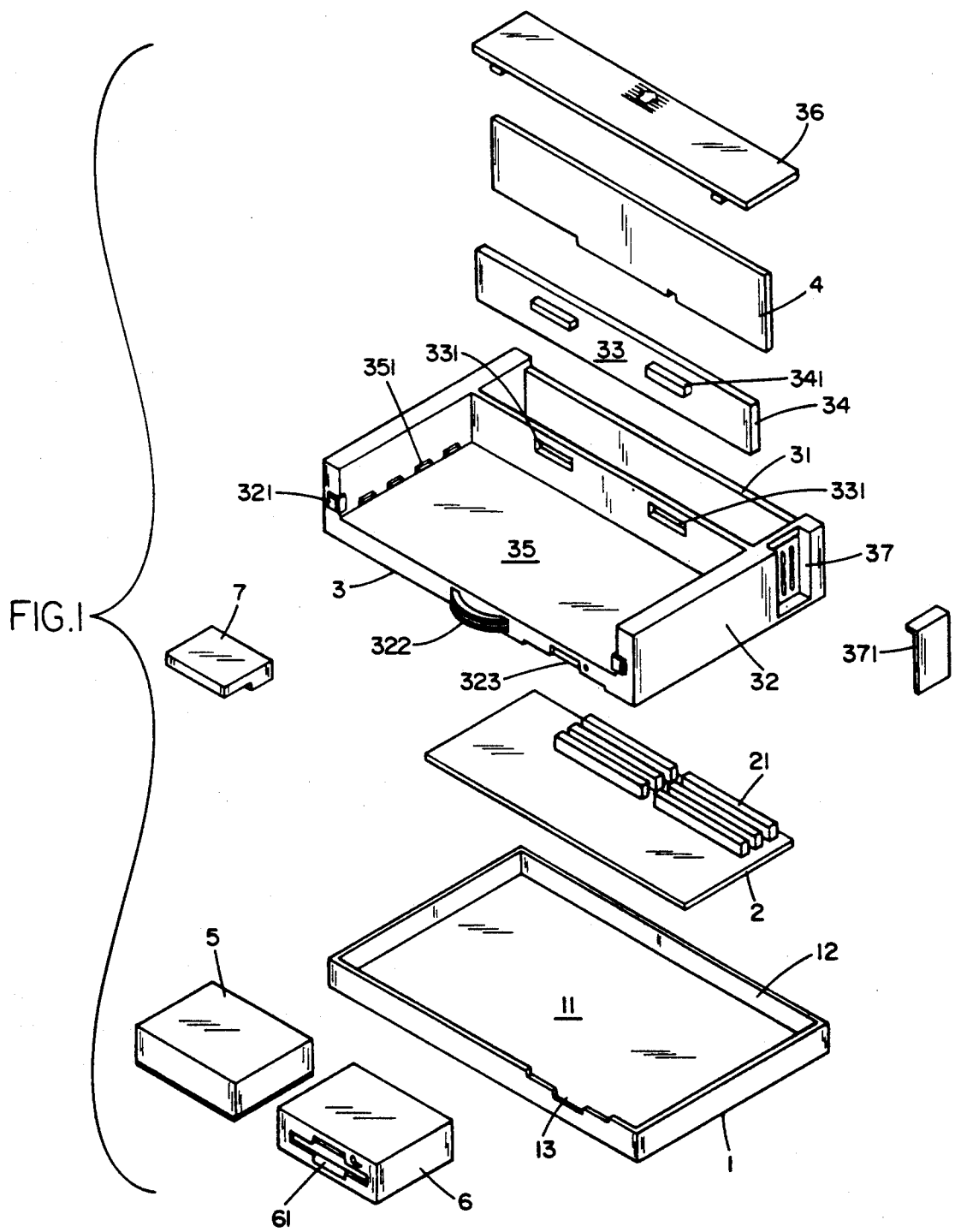
FIG. 1 is a dismantled view of the preferred embodiment of the portable note-book computer expansion device of the present invention.
Figure 2:
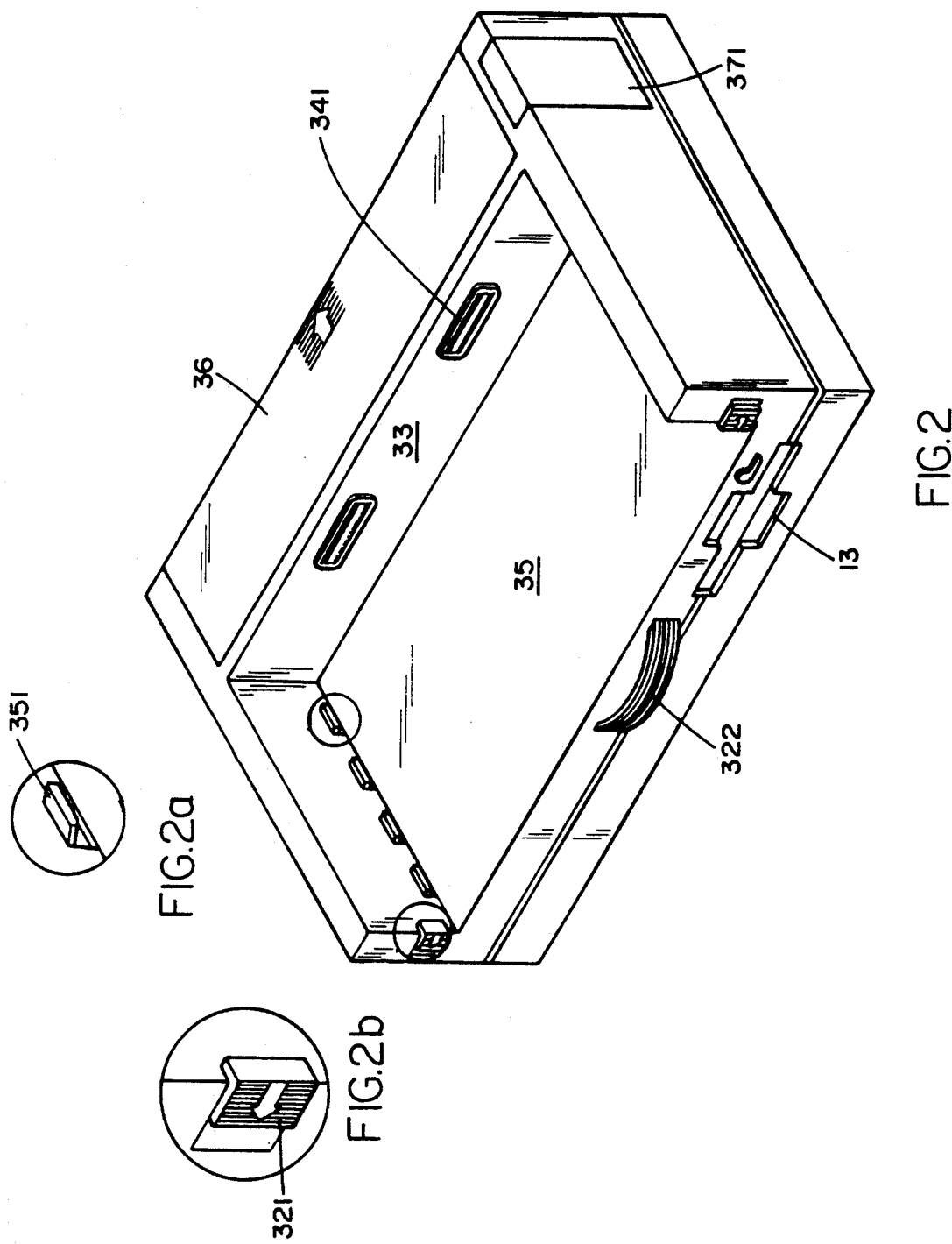
FIG. 2 is a perspective view of the preferred embodiment of the portable note-book computer expansion device of the present invention.

Referring to the annexed drawings in detail, therein illustrated is a portable note-book computer expansion device constructed according to the present invention and generally comprised of a base 1, a mother board 2, a note-book computer holder 3, a variety of expansion cards 4, a hard disk drive 5, a floppy disk drive 6 and a battery case 7. The base 1 has a vertical wall 12 vertically raising from a flat bottom 11 around the periphery thereof, which vertical wall 12 has step-like notch 13 on the top edge thereof at a suitable location through which a floppy disk can be inserted into the disk slot 61 on the front face of the floppy disk drive 6. The mother board 2 is made of a flat board in size suitable for fastening in the base 1 in a fixed manner, having a plurality of expansion slots 21 at the top for mounting a variety of expansion cards 4. The note-book computer holder 3 is made in a substantially H-shaped structure, having two vertical side walls 32 vertically raising from a flat bottom 35 at two opposite sides, a division plate 33 vertically disposed above said flat bottom 35 between said two vertical side walls 32 which has two holes 331 thereon at locations corresponding to the two expansion ports on the back of a note-book computer, a vertical back wall 31 vertically disposed between said two vertical side walls 32, an expansion board 34 secured to said division plate 33 at the back which has two expansion plugs 341 respectively inserted in the two holes 331 on said division plate 33 for connecting the two expansion ports of the note-book computer that is mounted in the note-book computer holder 3, a cover plate 36 covering over the space between said division plate 33 and said vertical back wall 31. The flat bottom 35 of the note-book computer holder 3 has two rows of hooks 351 at two opposite ends for hooking anote-book computer in place, a handle 322 on the front end thereof for carrying, a step-like notch 323 on the bottom edge thereof at a location corresponding to the step-like notch 13 on the base 1 for matching. The two vertical side walls 32 of the note-book computer holder 3 have each a latch 321 on the front end thereof for locking a note-book computer inside the note-book computer holder 3. Further, one of the two vertical side walls 32 has an expansion port 37 at one side corresponding to the expansion cards 4 which are connected to the expansion slots 21 on the mother board 2 and vertically disposed in the space between the division plate 33 and the vertical back wall 31, which expansion port 37 is covered with a side cap 371. In the present invention, a variety of expansion cards 4 (for example, IBM's functional cards) may be used to fasten in the expansion slots 21 on the mother board 2 to increase the functions of the note-book computer that is inserted in the note-book computer holder 3. The hard disk drive 5 is of a known device, fastened in the base 1 beneath the note-book computer holder 3 and in front of the mother board 2. It is connected to the mother board 2 to receive instructions therefrom so as to execute pre-programmed functions. The floppy disk drive is a known 5" FDD fixedly fastened in the base 1 by the hard disk drive 5 with the disk slot 61 thereof disposed behind the step-like notch 13 on the base 1 for inserting a floppy disk. The battery case 7 is fixedly fastened in the base 1 and connected to the mother board 2 to provide necessary working voltage. After assembly, as shown in FIG. 2, a portable note-book computer expansion device is set up, which has self-provided hard disk drive, floppy disk drive and expansion cards for use to increase the functions of a note-book computer.

Figure 3:
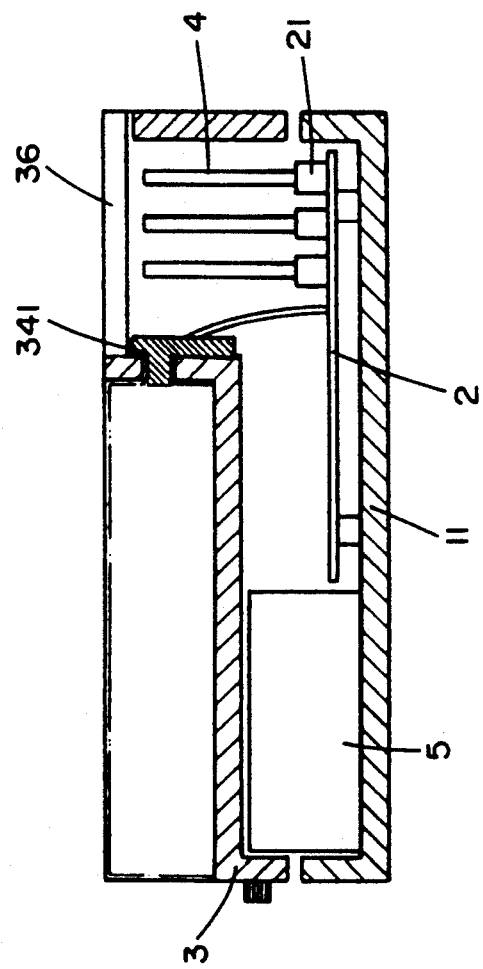
FIG. 3 is a sectional elevation thereof.

Referring to FIG. 3, when a note-book computer is fastened in the portable note-book computer expansion device, as shown in the dotted line, the hard disk drive 5, the floppy disk drive 6 and the various expansion cards 4 which are fastened in the expansion slots 21 of the mother board 2 are respectively connected to said note-book computer to greatly increase its capacity and functions.

As indicated, the present invention is to provide a portable note-book computer expansion device for use to increase the capacity and functions of a note-book computer. However, it is to be understood that the drawings are designed for purposes of illustration only, and are not intended as a definition of the limits and scope of the invention disclosed.

What is claimed is:

1. A portable note-book computer expansion device for holding and connecting a note-book computer to increase its capacity and functions, comprising:

a base having a vertical wall vertically raising from a flat bottom around the periphery thereof defining therewith a holding space, said vertical wall having a notch on the top edge thereof at one end;

a mother board fixedly set in said base, having a plurality of expansion slots thereon;

a note-book computer holder mounted on said base at the top comprising a flat bottom, two vertical side walls vertically extending from said flat bottom at two opposite sides, a division plate vertically disposed above said flat bottom between said two vertical side walls, said division plate having two holes therein, a vertical back wall vertically disposed between said two vertical side walls behind and spaced from said division plate, and expansion board secured to said division plate at the back and electrically connected to said mother board, said expansion board having two expansion plugs respectively inserted extending through the two holes on said division plate for connecting a note-book computer that is mounted in said note-book computer holder, a cover plate covering over the space between said division plate and said vertical back wall, the two rows of hooks on the flat bottom thereof at two opposite ends for hooking a note-book computer in place, a handle on the flat bottom thereof at the front for carrying, a notch on the bottom edge thereof which together with the notch on said base further comprises a floppy disk loading port, two latches on the two vertical side walls thereof at the front for locking a note-book computer therein, an expansion port on one of the two vertical side walls thereof at one side covered with a side cap;

a plurality of expansion cards fastened in the expansion slots on said mother board;

a hard disk drive fastened in said base and connected to said mother board; and a floppy disk drive fastened in said base and connected to said mother board, having a disk slot at the front face thereof disposed behind said floppy disk loading port.

* * * * *